(12) United States Patent
Yoon

(10) Patent No.: US 10,395,735 B2
(45) Date of Patent: Aug. 27, 2019

(54) ELECTRONIC DEVICE AND METHOD INCLUDING MEMORY WITH FIRST AND SECOND WRITE CURRENTS

(71) Applicant: SK hynix Inc., Icheon-si, Gyeonggi-do (KR)

(72) Inventor: Jung-Hyuk Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 136 days.

(21) Appl. No.: 15/156,657

(22) Filed: May 17, 2016

(65) Prior Publication Data

US 2017/0206961 A1     Jul. 20, 2017

(30) Foreign Application Priority Data

Jan. 19, 2016  (KR) .......................... 10-2016-0006406

(51) Int. Cl.
*G11C 13/00* (2006.01)
*G06F 3/06* (2006.01)
(Continued)

(52) U.S. Cl.
CPC .......... *G11C 13/0069* (2013.01); *G06F 3/061* (2013.01); *G06F 3/0656* (2013.01); *G06F 3/0679* (2013.01); *G06F 12/0802* (2013.01); *G11C 11/1655* (2013.01); *G11C 11/1657* (2013.01); *G11C 11/1675* (2013.01); *G06F 2212/2024* (2013.01); *G06F 2212/60* (2013.01); *G11C 2013/0078* (2013.01); *G11C 2213/76* (2013.01)

(58) Field of Classification Search
None
See application file for complete search history.

(56) References Cited

U.S. PATENT DOCUMENTS 7,869,258 B2 *  1/2011  Scheuerlein ....... G11C 13/0007
                                                365/148
8,223,565 B2 *  7/2012  Ueda ...................... G11C 11/16
                                                365/148
(Continued)

FOREIGN PATENT DOCUMENTS

KR    1020120040516 A    4/2012
KR       101150547 B1    5/2012

*Primary Examiner* — Harry W Byrne
*Assistant Examiner* — R Lance Reidlinger
(74) *Attorney, Agent, or Firm* — William Park & Associates Ltd.

(57) ABSTRACT

An electronic device including a semiconductor memory may be provided. The semiconductor memory may include a write circuit configured for generating a first current. The semiconductor memory may include a first selection circuit configured for coupling the first write circuit to a first line based on a first selection signal. The semiconductor memory may include a second write circuit configured for generating a second current. The semiconductor memory may include a second selection circuit configured for coupling the second write circuit to a second line based on a second selection signal. The semiconductor memory may include a memory cell coupled between the first line and the second line. The semiconductor memory may include a voltage control circuit configured for controlling a voltage level of the second line.

21 Claims, 8 Drawing Sheets

(51) Int. Cl.
*G06F 12/0802* (2016.01)
*G11C 11/16* (2006.01)

(56) References Cited

U.S. PATENT DOCUMENTS

| | | | |
|---|---|---|---|
| 8,959,250 B2* | 2/2015 | Lee .................... | H01L 43/08 710/11 |
| 9,368,205 B2* | 6/2016 | Mantegazza ....... | G11C 13/0069 |
| 2011/0063897 A1* | 3/2011 | Ong .................... | G11C 11/16 365/158 |
| 2013/0107615 A1* | 5/2013 | Keshtbod ............ | G11C 11/1675 365/158 |

* cited by examiner

ELECTRONIC DEVICE AND METHOD INCLUDING MEMORY WITH FIRST AND SECOND WRITE CURRENTS

CROSS-REFERENCE TO RELATED APPLICATIONS

The present application claims priority of Korean Patent Application No. 10-2016-0006406, entitled "ELECTRONIC DEVICE" and filed on Jan. 19, 2016, which is incorporated herein by reference in its entirety.

BACKGROUND

1. Technical Field

This patent document relates to memory circuits or devices and their applications in electronic devices or system.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device whose write operational performance is improved.

In an embodiment, an electronic device may be provided. The electronic device may include a semiconductor memory. The semiconductor memory may include a write circuit configured for generating a first current. The semiconductor memory may include a first selection circuit configured for coupling the first write circuit to a first line based on a first selection signal. The semiconductor memory may include a second write circuit configured for generating a second current. The semiconductor memory may include a second selection circuit configured for coupling the second write circuit to a second line based on a second selection signal. The semiconductor memory may include a memory cell coupled between the first line and the second line. The semiconductor memory may include a voltage control circuit configured for controlling a voltage level of the second line.

Implementations of the above electronic device may include one or more of the following.
The first write circuit block and the first selection block may operate in a first voltage domain. The second write circuit block and the second selection block may operate in a second voltage domain. The second voltage domain may be lower than the first voltage domain. The first voltage domain may include a voltage range between a ground voltage and a positive voltage, and the second voltage domain may include a voltage range between a negative voltage and the ground voltage. The memory block may include: a variable resistance element coupled to the first line; and a selection element coupled between the variable resistance element and the second line. The first current may include a write current for controlling a resistance state of the variable resistance element, and the second current may include a threshold current for controlling a switching operation of the selection element. The voltage control block may be coupled to the second line or a node between the second line and the second write circuit block. The voltage control block may include one of a diode, a diode-connected PMOS transistor and a diode-connected NMOS transistor, which is coupled between a bias voltage terminal where a bias voltage is supplied and the second line or coupled between the bias voltage terminal and the node. The voltage control block may include a precharge element for coupling a precharge voltage terminal where a precharge voltage is supplied to the second line based on a precharge signal. The voltage control circuit may be configured to limit the voltage level of the second line to a predetermined voltage level.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an embodiment, a method for driving an electronic device including a semiconductor memory may be provided. The method may include supplying a high voltage through a first line coupled to one side of a memory cell and supplying a low voltage through a second line coupled to the other side of the memory cell. The method may include controlling a second current for controlling a switching operation of a selection element included in the memory cell to flow into the memory cell. The method may include controlling the second line with a predetermined voltage between the high voltage and the low voltage. The method may include controlling a first current for controlling a resistance state of a variable resistance element included in the memory cell to flow in the memory cell.

Implementations of the above method may include one or more of the following.

The high voltage may include a positive voltage, and the low voltage may include a negative voltage, and the predetermined voltage may include a ground voltage. The first current may be generated from a first write circuit block coupled between the first line and a supply terminal of the high voltage, and the second current may be generated from a second write circuit block coupled between the second line and a supply terminal of the low voltage.

In an embodiment, an electronic device may be provided. The electronic device may include a semiconductor memory. The semiconductor memory may include a write circuit configured for generating a first current. The semiconductor memory may include a first selection circuit configured for coupling the first write circuit to a first line based on a first selection signal. The semiconductor memory may include a second write circuit configured for generating a second current. The semiconductor memory may include a second selection circuit configured for coupling the second write circuit to a second line based on a second selection signal. The semiconductor memory may include a memory cell coupled between the first line and the second line. The semiconductor memory may include a voltage control circuit configured for preventing a leakage current from flowing to the first line from the first selection circuit during a write operation of the memory cell These and other aspects, implementations and associated advantages are described in greater detail in the drawings, the description and the claims.

DETAILED DESCRIPTION

Figure 1:
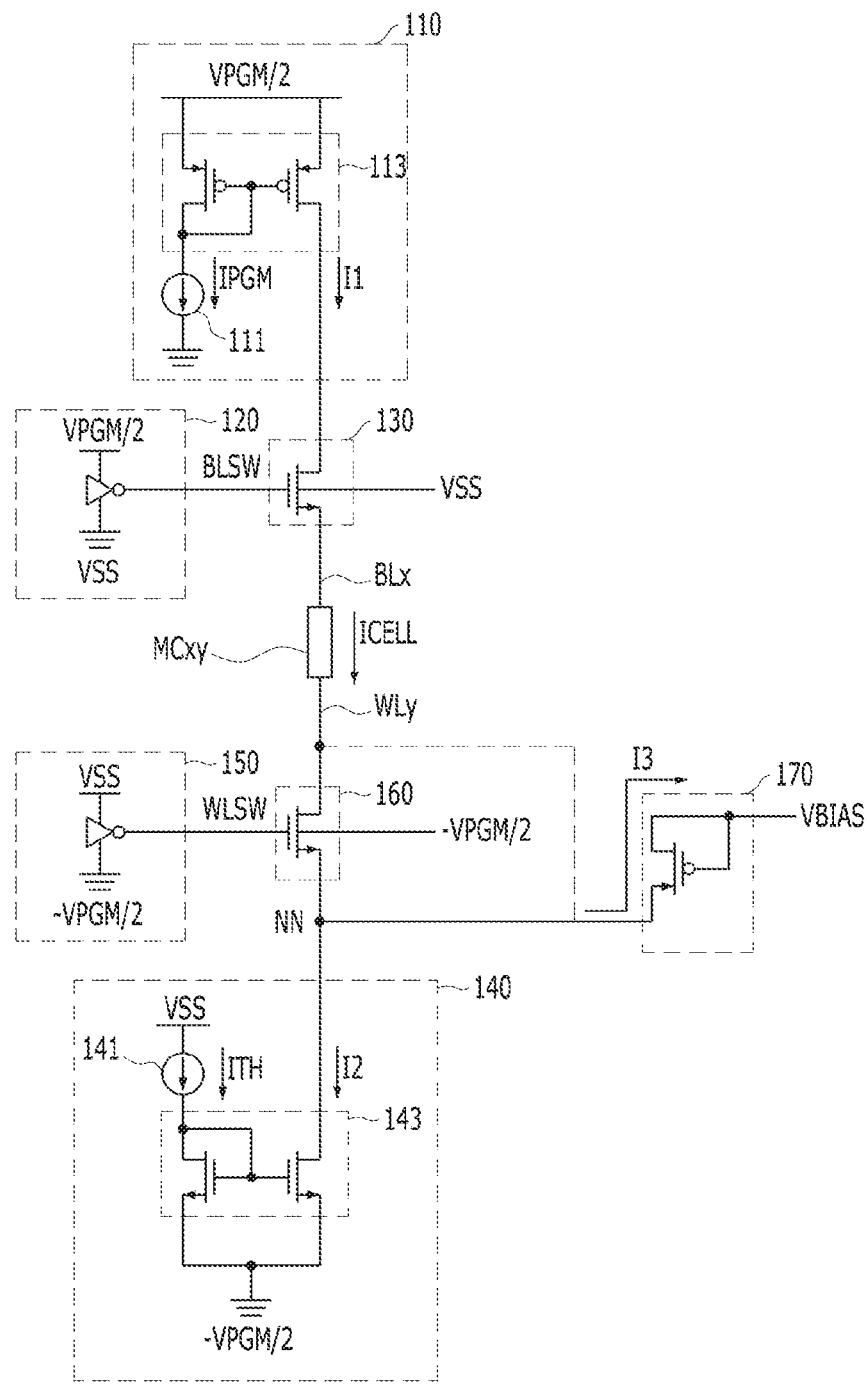
FIG. 1 is a circuit diagram illustrating a representation of an example of a memory device in accordance with an embodiment.

Various examples and implementations of the disclosed technology are described below with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as illustrated reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single layer or a multi layer that exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO) or a cobalt oxide (CoO), and/or a perovskite material such as a strontium titanium oxide (STO: SrTiO) and/or a praseodymium calcium manganese oxide (PCMO: PrCaMnO).

Moreover, the variable resistance element may include a phase change material. The phase change material may include a chalcogenide material such as germanium-antimony-tellurium (GST: GeSbTe). The variable resistance element switches between different resistance states by changing a crystal state or an amorphous state using a heat.

Also, the variable resistance element may include a structure having a tunnel barrier layer interposed between two magnetic layers. The magnetic layer may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to a magnetization direction of the magnetic layer. For example, the variable resistance element may be in a low resistance state when a magnetization direction of two magnetic layers is parallel, and be in a high resistance state when a magnetization direction of two magnetic layers is anti-parallel.

FIG. 1 is a circuit diagram illustrating a representation of an example of a memory device in accordance with an embodiment.

Referring to FIG. 1, a memory device 100 may include a first write circuit 110, a column decoding circuit 120, a column selection circuit 130, a bit line BLx, a memory cell MCxy, a word line WLy, a second write circuit 140, a row decoding circuit 150, a row selection circuit 160, and a voltage control circuit 170. For the sake of convenience in description, it should be noted that a single bit line BLx, a single memory cell MCxy, and a single word line WLy are described in the implementation of the present disclosure.

The first write circuit 110 may generate a first current I1. For example, the first write circuit 110 may include a write current generator 111 and a first mirroring circuit 113. The write current generator 111 may generate a write current IPGM corresponding to a write data to be written in the memory cell MCxy. For example, the write current generator 111 may generate the write current IPGM having a high level for a short duration, corresponding to the write data having a first logic level. The write current IPGM having the high level may be referred to as a reset current. The write current generator 111 may generate the write current IPGM having a low level for a long duration, corresponding to the write data having a second logic level. The write current IPGM having the low level may be referred to as a set current. For example, the write current generator 111 may be coupled between the first mirroring circuit 113 and a ground voltage VSS terminal and may include a current digital-to-analog converter (IDAC). The first mirroring circuit 113 may mirror the write current IPGM to generate the first current I1. For example, the first mirroring circuit 113 may include a first PMOS transistor and a second PMOS transistor. The first PMOS transistor may have a drain and a source coupled between the write current generator 111 and a positive voltage VPGM/2 terminal and a gate coupled to the drain. The second PMOS transistor may have a drain and a source coupled between the column selection circuit 130 and the positive voltage VPGM/2 terminal and a gate coupled to the first PMOS transistor in common.

The column decoding circuit 120 may generate a column selection signal BLSW. For example, the column decoding circuit 120 may include a driver for generating the column selection signal BLSW that swings between the positive voltage VPGM/2 and a ground voltage VSS.

The column selection circuit 130 may couple the first write circuit 110 to the bit line BLx based on the column selection signal BLSW. The column selection circuit 130 may transmit a cell current ICELL corresponding to the first current I1 to the bit line BLx. For example, the column selection circuit 130 may include an NMOS transistor having a drain and a source coupled between the first write circuit 110 and the bit line BLx, a gate where the column selection signal BLSW is inputted and a bulk coupled to the ground voltage VSS terminal.

The memory cell MCxy may be coupled between the bit line BLx and the word line WLy. For example, the memory cell MCxy may include a variable resistance element (not illustrated) and a selection element (not illustrated) coupled between the bit line BLx and the word line WLy in series. The variable resistance element may include the phase change material. In this case, the variable resistance element may store the write data having the first logic level based on the cell current ICELL corresponding to the reset current. In other words, the variable resistance element may have a high resistance state corresponding to the amorphous state. The variable resistance element may store the write data having the second logic level based on the cell current ICELL corresponding to the set current. In other words, the variable resistance element may have a low resistance element corresponding to a crystal state. The selection element may perform a switching operation based on the cell current ICELL. For example, the selection element may include an ovonic threshold switch (OTS). The selection element may be turned on when the cell current ICELL is equal to or higher than a threshold current.

The second write circuit 140 may generate a second current I2. For example, the second write circuit 140 may include a threshold current generator 141 and a second mirroring circuit 143. The threshold current generator 141 may generate a threshold current Ith for controlling the switching operation of the selection element. For example, the threshold current generator 141 may be coupled between the ground voltage VSS terminal and the second mirroring circuit 143 and may include the IDAC. The second mirroring circuit 143 may mirror the threshold current Ith to generate the second current I2. For example, the second mirroring circuit 143 may include a first NMOS transistor and a second NMOS transistor. The first NMOS transistor may have a drain and a source coupled between the threshold current generator 141 and a negative voltage −VPGM/2 terminal and a gate coupled to the drain. The second NMOS transistor may have a drain and a source coupled between the row selection circuit 160 and the negative voltage −VPGM/2 terminal and a gate coupled to the first NMOS transistor in common.

The row decoding circuit 150 may generate a row selection signal WLSW. For example, the row decoding circuit 150 may include a driver for generating the row selection signal WLSW that swings between the ground voltage VSS and a negative voltage −VPGM/2.

The row selection circuit 160 may couple the word line WLy to the second write circuit 140 based on the row selection signal WLSW. The row selection circuit 160 may transmit the cell current ICELL to the second write circuit 140. For example, the row selection circuit 160 may include an NMOS transistor having a drain and a source coupled between the word line WLy and the second write circuit 140, a gate where the row selection signal WLSW is inputted and a bulk coupled to the negative voltage −VPGM/2 terminal.

The voltage control circuit 170 may control a voltage level of the word line WLy. In other words, the voltage control circuit 170 may limit the voltage level of the word line WLy not to rise over a predetermined voltage level. For example, the voltage control circuit 170 may include a diode-connected PMOS transistor. In other words, the diode-connected PMOS transistor may have a source and a drain coupled between a node NN between the second write circuit 140 and the row selection circuit 160 and a bias voltage VBIAS terminal and may have a gate coupled to the bias voltage VBIAS terminal. In this case, the voltage control circuit 170 may limit the voltage level of the word line WLy not to exceed a combined voltage VBIAS+Vth (hereinafter, referred to as a "limit voltage") of a bias voltage VBIAS and a threshold voltage Vth of the diode-connected PMOS transistor.

Although it is described in the implementation of the present disclosure that the voltage control circuit 170 is coupled between the node NN and the bias voltage VBIAS terminal, the embodiments are not limited to this, and the voltage control circuit 170 may be coupled between the word line WLy and the bias voltage VBIAS terminal in accordance with the present disclosure.

Circuits 110, 120 and 130 formed on the bit line BLx side with the memory cell MCxy as the center may operate in a first voltage domain, and circuits 140, 150 and 160 formed on the word line WLy side with the memory cell MCxy as the center may operate in a second voltage domain which is lower than the first voltage domain. For example, the first voltage domain may include a voltage range between the ground voltage VSS and the positive voltage VPGM/2, and the second voltage domain may include a voltage range between the negative voltage −VPGM/2 and the ground voltage VSS.

Hereinafter, an operation of the memory device 100 having an aforementioned structure is described.

The memory device 100 may select the memory cell MCxy to write the write data. For example, the column decoding circuit 120 may enable the column selection signal BLSW, and the column selection circuit 130 may couple the bit line BLx coupled to one side of the memory cell MCxy to the first write circuit 110 based on the column selection signal BLSW. The row decoding circuit 150 may enable the row selection signal WLSW, and the row selection circuit 160 may couple the word line WLy coupled to the other side of the memory cell MCxy to the second write circuit 140 based on the row selection signal WLSW. Then, the positive voltage VPGM/2 may be supplied to one side of the memory cell MCxy through the first write circuit 110, the column decoding circuit 120 and the bit line BLx, and the negative voltage −VPGM/2 may be supplied to the other side of the memory cell MCxy through the second write circuit 140, the row selection circuit 160 and the word line WLy. Therefore, a voltage difference VPGM having enough level to write the write data may occur in both sides of the memory cell MCxy.

Under the circumstances, the memory device 100 may control the second current I2 to flow through the memory cell MCxy. For example, the first write circuit 110 may generate the first current I1 corresponding to the write current IPGM, and the second write circuit 140 may generate the second current I2 corresponding to the threshold current Ith. Since a drain-source voltage Vds of the second PMOS transistor included in the first write circuit 110 is not sufficiently secured, the first write circuit 110 may generate a current that is lower than the write current IPGM, i.e., the first current I1 corresponding to the second current I2. Therefore, the cell current ICELL corresponding to the second current I2 may flow through the memory cell MCxy.

Continuously, the memory device 100 may control the voltage levels of the bit line BLx and the word line WLy to the limit voltage VBIAS+Vth. For example, when the cell current ICELL corresponding to the second current I2 flows through the memory cell MCxy, the selection element included in the memory cell MCxy may be turned on. When the selection element is turned on, the bit line BLx, the word line WLy and the node NN may rise to a voltage level that is near to the positive voltage VPGM/2. As the node NN has a voltage level that is higher than the limit voltage VBIAS+Vth level (VPGM/2>VBIAS+Vth), the voltage control circuit 170 may be enabled and may control the voltage level of the node NN or the word line WLy to the limit voltage VBIAS+Vth level. For example, the enabled voltage control circuit 170 may run a third current I3, and therefore, the first write circuit 110 may generate the first current I1 corresponding to the threshold current Ith and gradually generate the first current I1 corresponding to the write current IPGM. In other words, when the node NN has the limit voltage VBIAS+Vth level, the voltage control circuit 170 may be enabled and may run the third current I3, which is left after subtracting second current I2 from the first current I1 flowing through the node NN, to the bias voltage VBIAS terminal. Therefore, the first node NN may be controlled to the limit voltage VBIAS+Vth level. Since the selection element is turned on, the bit line BLx may be also controlled to the limit voltage VBIAS+Vth level. For example, it is desired that the limit voltage VBIAS+Vth level is designed to correspond to the ground voltage VSS.

The memory device 100 may control the first current I1 to flow through the memory cell MCxy. For example, when the bit line BLx and the word line WLy are controlled to the limit voltage VBIAS+Vth level, the drain-source voltage Vds of the second PMOS transistor may be sufficiently secured. Therefore, the first write circuit 110 may generate the first current I1 corresponding to the write current IPGM. The resistance state of the variable resistance element included in the memory cell MCxy may be decided based on the cell current ICELL corresponding to the first current I1.

As described above, as a bit line and a word line are controlled to a predetermined voltage level, e.g., VBIAS+Vth, during a write operation, a leakage current due to a PN junction may be prevented from flowing in the bit line from a bulk of an NMOS transistor included in a column selection circuit, and consequently, operational characteristics of a semiconductor memory may be improved.

Figure 2:
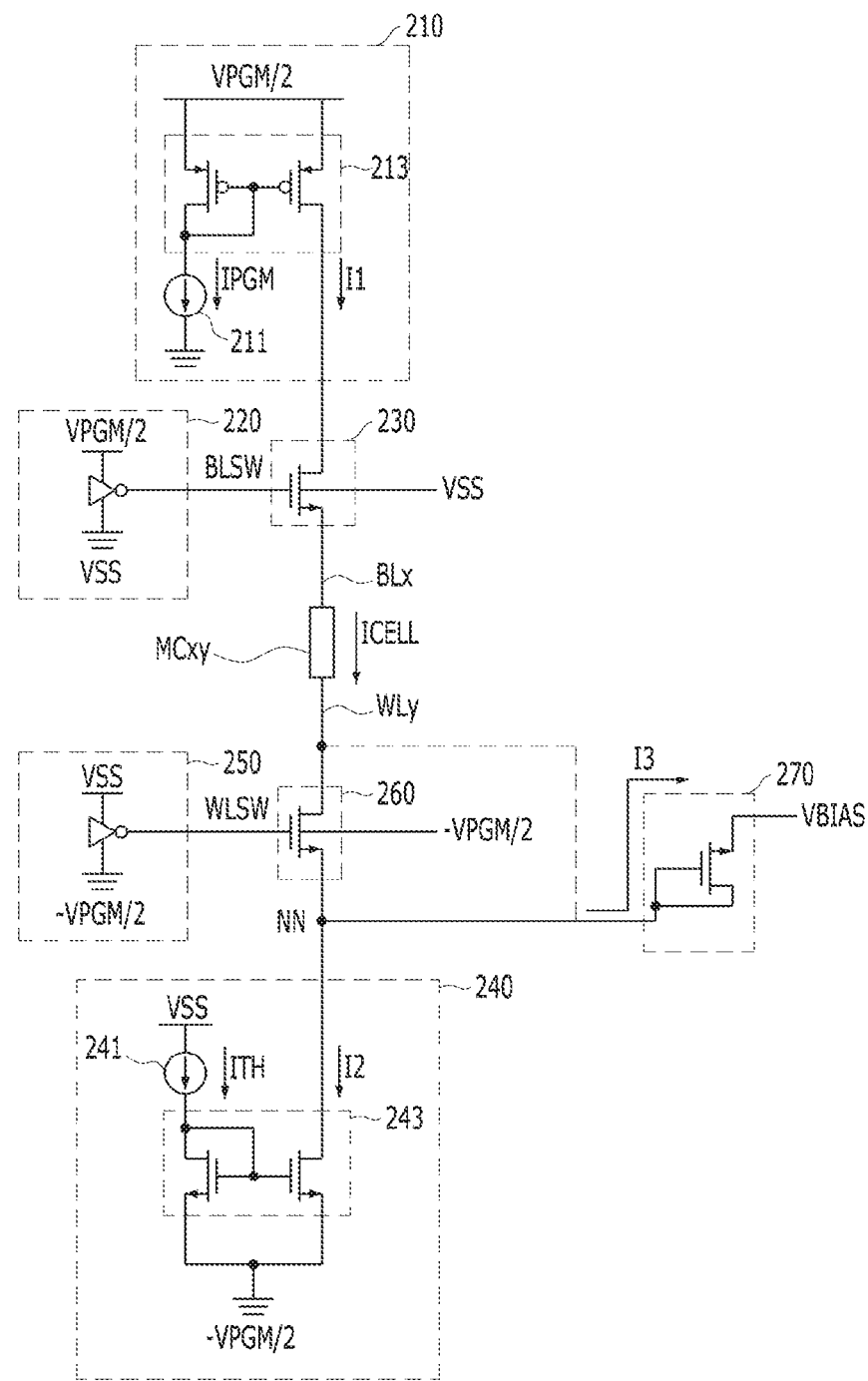
FIG. 2 is a circuit diagram illustrating a representation of an example of a memory device in accordance with an embodiment.

FIG. 2 is a circuit diagram illustrating a representation of an example of a memory device in accordance with an embodiment.

Referring to FIG. 2, a memory device 200 may include a first write circuit 210, a column decoding circuit 220, a column selection circuit 230, a bit line BLx, a memory cell MCxy, a word line WLy, a second write circuit 240, a row decoding circuit 250, a row selection circuit 260, and a voltage control circuit 270.

Since the first write circuit 210, the column decoding circuit 220, the column selection circuit 230, the bit line BLx, the memory cell MCxy, the word line WLy, the second write circuit 240, the row decoding circuit 250, and the row selection circuit 260 are the same as the first write circuit 110, the column decoding circuit 120, the column selection circuit 130, the bit line BLx, the memory cell MCxy, the word line WLy, the second write circuit 140, the row decoding circuit 150, and the row selection circuit 160 as described above, descriptions thereon are omitted herein.

The voltage control circuit 270 may control a voltage level of the word line WLy. In other words, the voltage control circuit 270 may limit the voltage level of the word line WLy not to rise over a predetermined voltage level. For example, the voltage control circuit 270 may include a diode-connected NMOS transistor. In other words, the diode-connected NMOS transistor may have a source and a drain coupled between a node NN between the second write circuit 240 and the row selection circuit 260 and a bias voltage VBIAS terminal and may have a gate coupled to the node NN. In this case, the voltage control circuit 270 may limit the voltage level of the word line WLy not to exceed a limit voltage VBIAS+Vth level of a bias voltage VBIAS and a threshold voltage Vth of the diode-connected NMOS transistor.

Although it is described in an implementation of the present disclosure that the voltage control circuit 270 is coupled between the node NN and the bias voltage VBIAS terminal, the embodiments not limited to this, and the voltage control circuit 270 may be coupled between the word line WLy and the bias voltage VBIAS terminal in accordance with the present disclosure.

Since the overall operations of the memory device 200 in this implementation of the present disclosure are the same or substantially the same as the operations of the memory device 100 that is previously described, except for the voltage control circuit 270, the operations of the memory device 200 are omitted herein.

Figure 3:
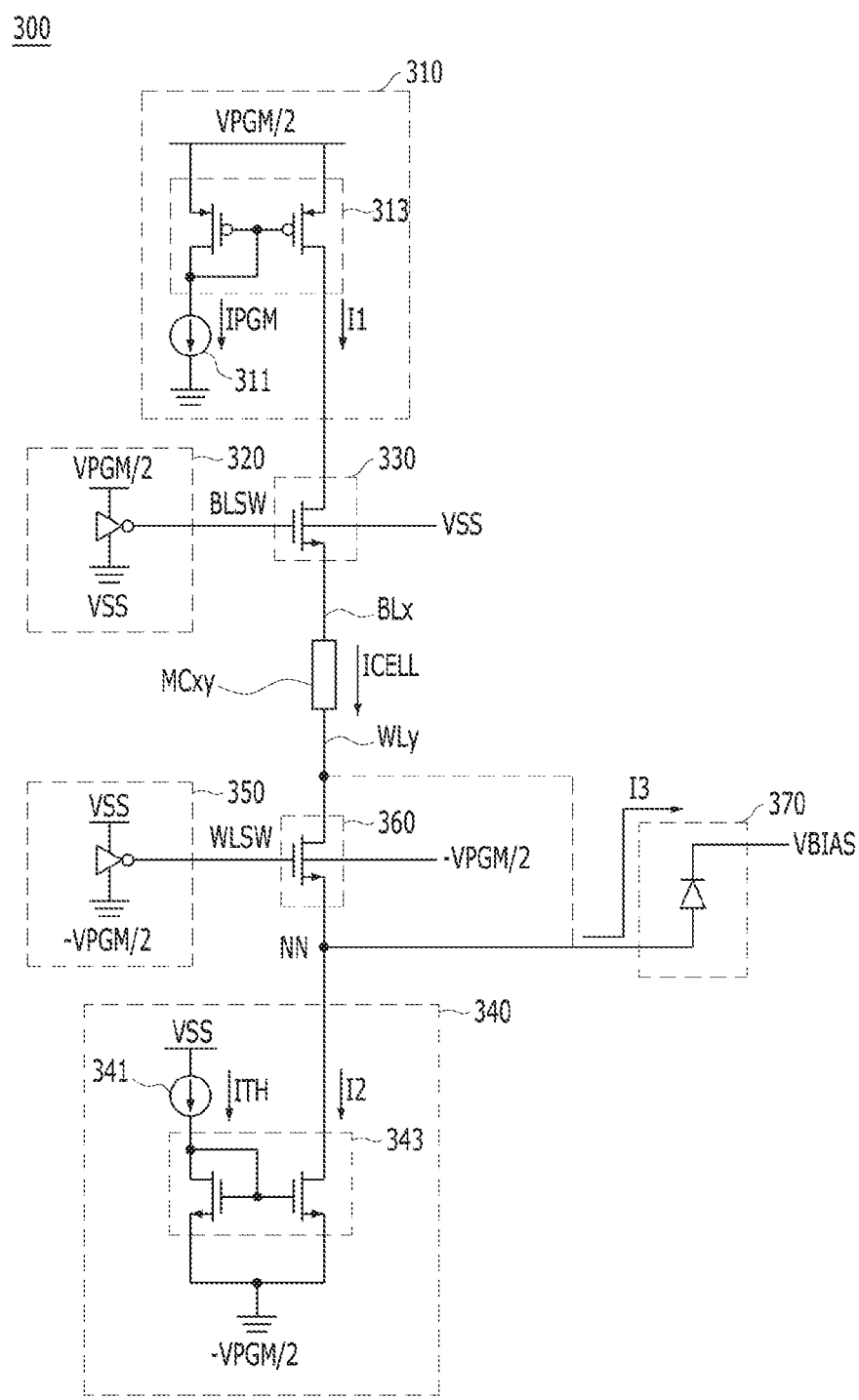
FIG. 3 is a circuit diagram illustrating a representation of an example of a memory device in accordance with an embodiment.

FIG. 3 is a circuit diagram illustrating a representation of an example of a memory device in accordance with an embodiment.

Referring to FIG. 3, a memory device 300 may include a first write circuit 310, a column decoding circuit 320, a column selection circuit 330, a bit line BLx, a memory cell MCxy, a word line WLy, a second write circuit 340, a row decoding circuit 350, a row selection circuit 360, and a voltage control circuit 370.

Since the first write circuit 310, the column decoding circuit 320, the column selection circuit 330, the bit line BLx, the memory cell MCxy, the word line WLy, the second write circuit 340, the row decoding circuit 350, and the row selection circuit 360 are the same as the first write circuit 110, the column decoding circuit 120, the column selection circuit 130, the bit line BLx, the memory cell MCxy, the word line WLy, the second write circuit 140, the row decoding circuit 150, and the row selection circuit 160 as described above, descriptions thereon are omitted herein.

The voltage control circuit 370 may control a voltage level of the word line WLy. In other words, the voltage control circuit 370 may limit the voltage level of the word line WLy not to rise over a predetermined voltage level. For example, the voltage control circuit 370 may include a diode. In other words, the diode may have an anode coupled to a node NN between the second write circuit 340 and the row selection circuit 360 and a cathode coupled to a bias voltage VBIAS terminal. In this case, the voltage control circuit 370 may limit the voltage level of the word line WLy not to exceed a limit voltage VBIAS+Vth level of a bias voltage VBIAS and a threshold voltage Vth of the diode.

Although it is described in an implementation of the present disclosure that the voltage control circuit 370 is coupled between the node NN and the bias voltage VBIAS terminal, the embodiments are not limited to this, and the voltage control circuit 370 may be coupled between the word line WLy and the bias voltage VBIAS terminal in accordance with the present disclosure.

Since the overall operations of the memory device 300 in this implementation of the present disclosure are the same or substantially the same as the operations of the memory device 100 that is previously described, except for the voltage control circuit 370, the operations of the memory device 300 are omitted herein.

Figure 4:
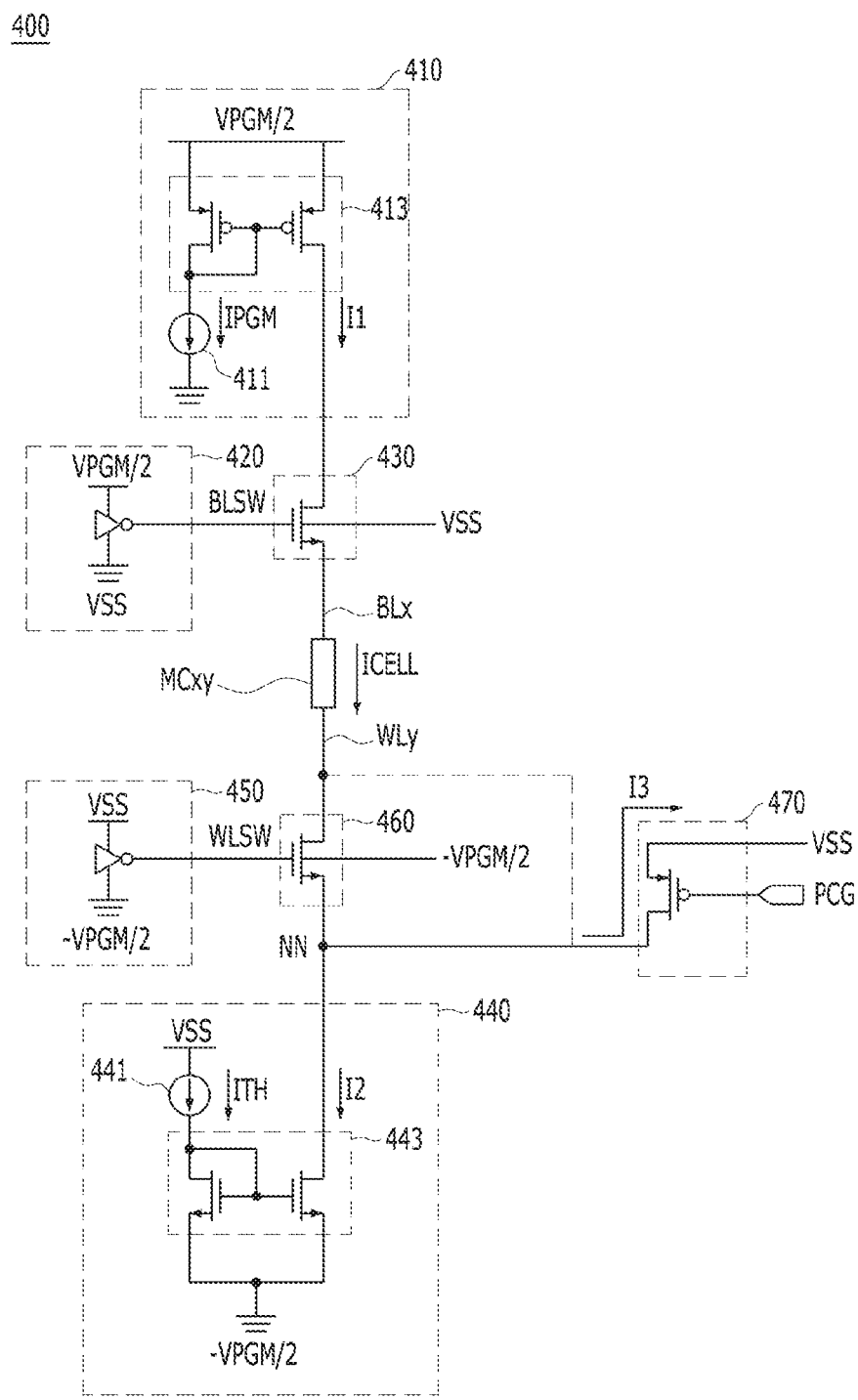
FIG. 4 is a circuit diagram illustrating a representation of an example of a memory device in accordance with an embodiment.

FIG. 4 is a circuit diagram illustrating a representation of an example of a memory device in accordance with an embodiment.

Referring to FIG. 4, a memory device 400 may include a first write circuit 410, a column decoding circuit 420, a column selection circuit 430, a bit line BLx, a memory cell MCxy, a word line WLy, a second write circuit 440, a row decoding circuit 450, a row selection circuit 460, and a voltage control circuit 470.

Since the first write circuit 410, the column decoding circuit 420, the column selection circuit 430, the bit line BLx, the memory cell MCxy, the word line WLy, the second write circuit 440, the row decoding circuit 450, and the row selection circuit 460 are the same as the first write circuit 110, the column decoding circuit 120, the column selection circuit 130, the bit line BLx, the memory cell MCxy, the word line WLy, the second write circuit 140, the row decoding circuit 150, and the row selection circuit 160 as described above, descriptions thereon are omitted herein.

The voltage control circuit 470 may control a voltage level of the word line WLy. In other words, the voltage control circuit 470 may limit the voltage level of the word line WLy not to rise over a predetermined voltage level. For example, the voltage control circuit 470 may include a PMOS transistor. In other words, the PMOS transistor may have a source and a drain coupled between a ground voltage VSS terminal and the word line WLy and a gate where a word line precharge signal PCG is inputted. For example, the voltage control circuit 470 may be formed as a precharge block for precharging the word line WLy with a ground voltage VSS level when the word line WLy is not selected. In this case, the precharge block may be used as the voltage control circuit 470. For example, even when the word line WLy is selected during a write operation, the word line precharge signal PCG may be controlled so that the ground voltage VSS terminal and the word line WLy are coupled to each other. Consequently, the voltage control circuit 470 may limit the voltage level of the word line WLy not to exceed a limit voltage VBIAS+Vth level of a ground voltage VSS and a threshold voltage Vth of the PMOS transistor.

Since the overall operations of the memory device 400 in this implementation of the present disclosure are the same or substantially the same as the operations of the memory device 100 that is previously described, except for the voltage control circuit 470, the operations of the memory device 400 are omitted herein. However, a process where the word line precharge signal PCG is enabled has to be included in the operations so that the PMOS transistor included in the voltage control circuit 470 may be turned on during the write operation.

In accordance with the implementations of the technology disclosed in this patent document, a semiconductor memory having good write operational performance, an electronic device including the semiconductor memory, and a method for driving the electronic device may be secured.

The above and other memory circuits or semiconductor devices based on the disclosed technology may be used in a range of devices or systems. FIGS. 5-9 provide some examples of devices or systems that may implement the memory circuits disclosed herein.

Figure 5:
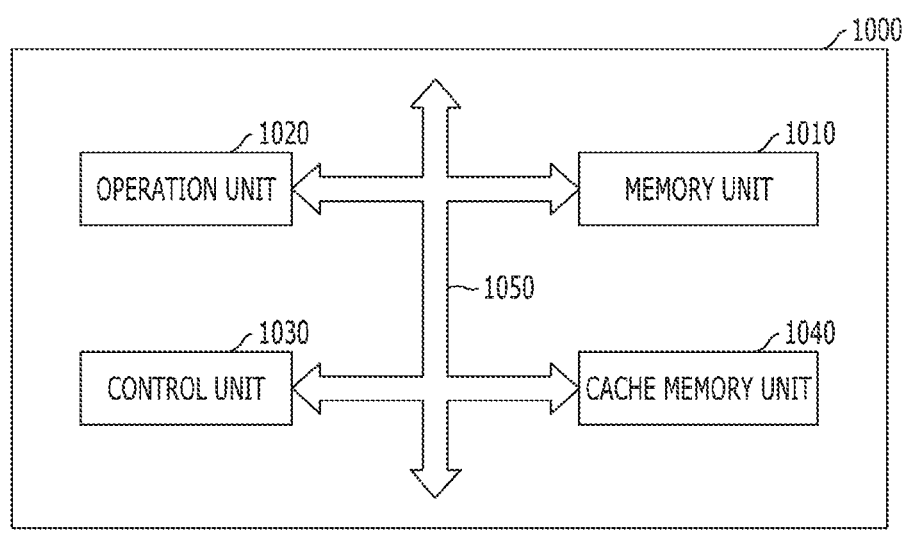
FIG. 5 is an example of configuration diagram of a microprocessor implementing memory circuitry based on the disclosed technology.

FIG. 5 is an example of configuration diagram of a microprocessor implementing memory circuitry based on the disclosed technology.

Referring to FIG. 5, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a write circuit suitable for generating a first current; a first selection circuit suitable for coupling the first write circuit to a first line based on a first selection signal; a second write circuit suitable for generating a second current; a second selection circuit suitable for coupling the second write circuit to a second line based on a second selection signal; a memory cell coupled between the first line and the second line; and a voltage control circuit suitable for controlling a voltage level of the second line. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 6:
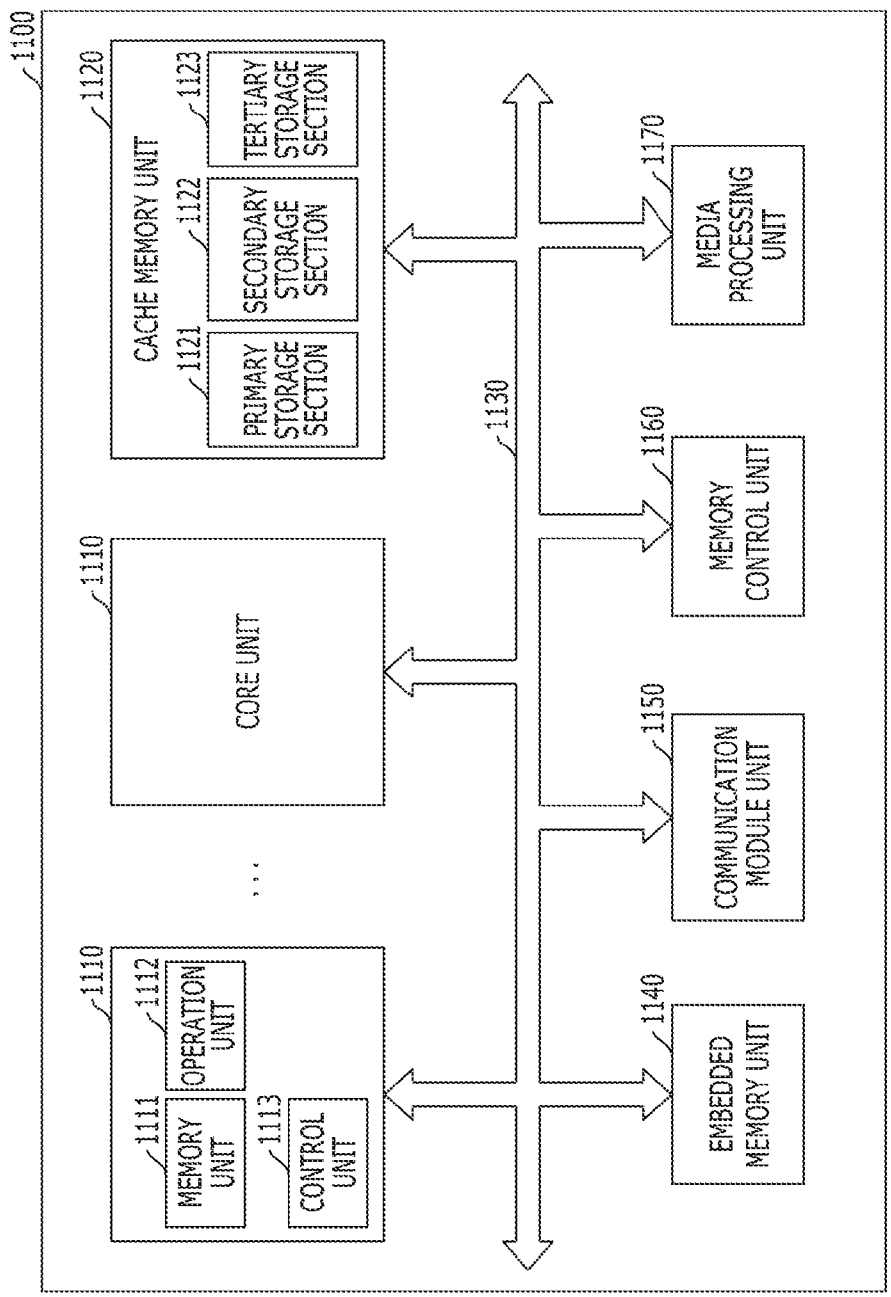
FIG. 6 is an example of configuration diagram of a processor implementing memory circuitry based on the disclosed technology.

FIG. 6 is an example of configuration diagram of a processor implementing memory circuitry based on the disclosed technology.

Referring to FIG. 6, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a write circuit suitable for generating a first current; a first selection circuit suitable for coupling the first write circuit to a first line based on a first selection signal; a second write circuit suitable for generating a second current; a second selection circuit suitable for coupling the second write circuit to a second line based on a second selection signal; a memory cell coupled between the first line and the second line; and a voltage control circuit suitable for controlling a voltage level of the second line.

Through this, characteristics of the cache memory unit 1120 may be improved. As a consequence, performance characteristics of the processor 1100 may be improved.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 7:
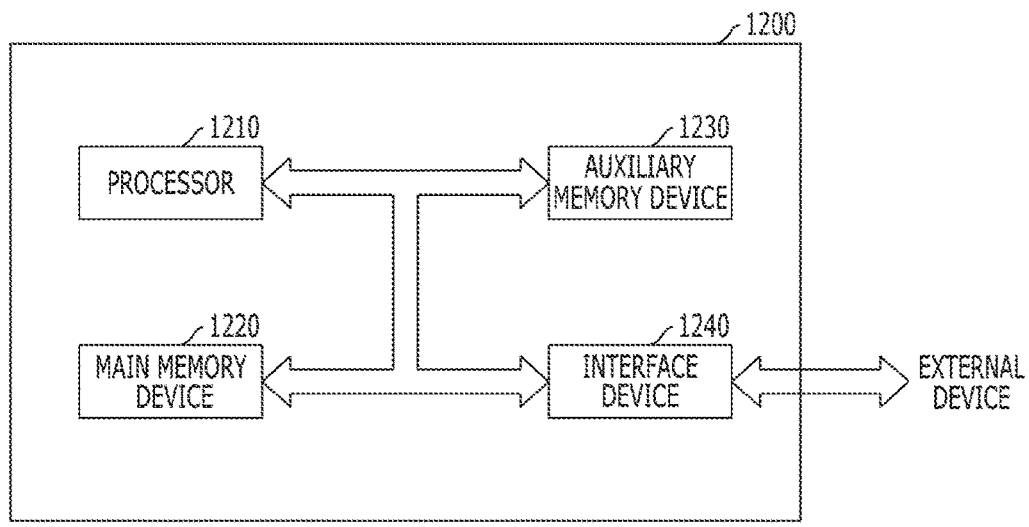
FIG. 7 is an example of configuration diagram of a system implementing memory circuitry based on the disclosed technology.

FIG. 7 is an example of configuration diagram of a system implementing memory circuitry based on the disclosed technology.

Referring to FIG. 7, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a write circuit suitable for generating a first current; a first selection circuit suitable for coupling the first write circuit to a first line based on a first selection signal; a second write circuit suitable for generating a second current; a second selection circuit suitable for coupling the second write circuit to a second line based on a second selection signal; a memory cell coupled between the first line and the second line; and a voltage control circuit suitable for controlling a voltage level of the second line. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a write circuit suitable for generating a first current; a first selection circuit suitable for coupling the first write circuit to a first line based on a first selection signal; a second write circuit suitable for generating a second current; a second selection circuit suitable for coupling the second write circuit to a second line based on a second selection signal; a memory cell coupled between the first line and the second line; and a voltage control circuit suitable for controlling a voltage level of the second line. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 8) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 8:
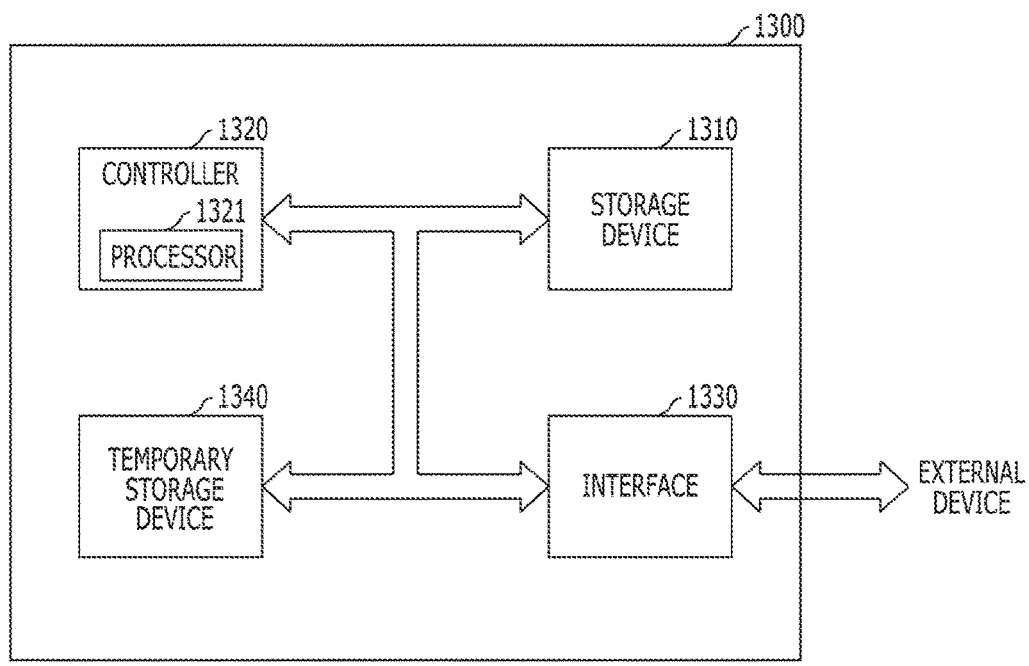
FIG. 8 is an example of configuration diagram of a data storage system implementing memory circuitry based on the disclosed technology.

FIG. 8 is an example of configuration diagram of a data storage system implementing memory circuitry based on the disclosed technology.

Referring to FIG. 8, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a write circuit suitable for generating a first current; a first selection circuit suitable for coupling the first write circuit to a first line based on a first selection signal; a second write circuit suitable for generating a second current; a second selection circuit suitable for coupling the second write circuit to a second line based on a second selection signal; a memory cell coupled between the first line and the second line; and a voltage control circuit suitable for controlling a voltage level of the second line. Through this, characteristics of the temporary storage device 1340 may be improved. As a consequence, performance characteristics of the system 1300 may be improved.

Figure 9:
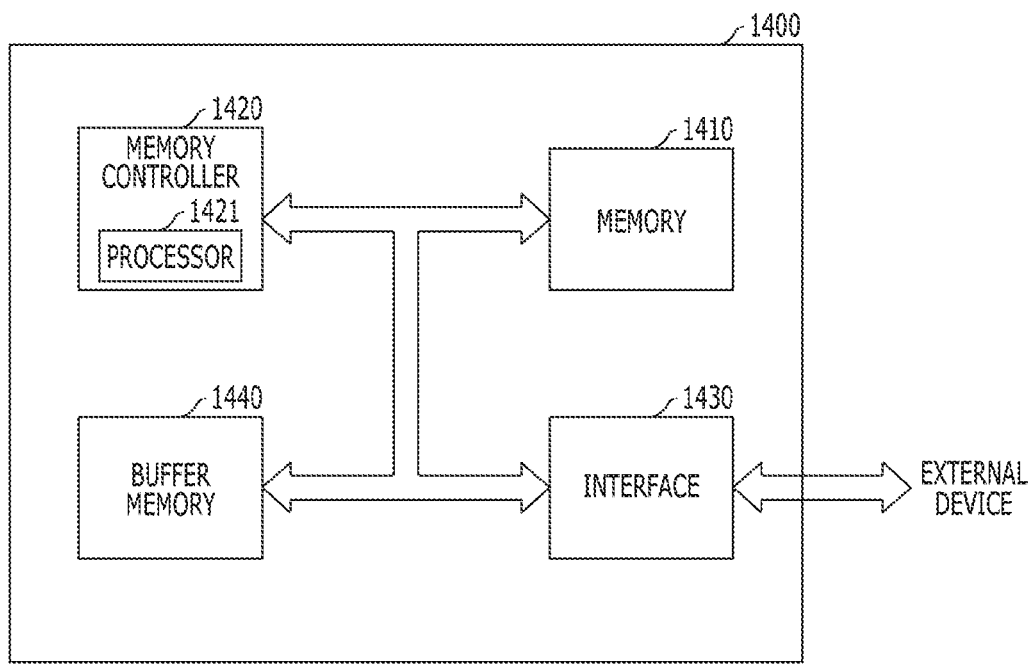
FIG. 9 is an example of configuration diagram of a memory system implementing memory circuitry based on the disclosed technology.

FIG. 9 is an example of configuration diagram of a memory system implementing memory circuitry based on the disclosed technology.

Referring to FIG. 9, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a write circuit suitable for generating a first current; a first selection circuit suitable for coupling the first write circuit to a first line based on a first selection signal; a second write circuit suitable for generating a second current; a second selection circuit suitable for coupling the second write circuit to a second line based on a second selection signal; a memory cell coupled between the first line and the second line; and a voltage control circuit suitable for controlling a voltage level of the second line. Through this, characteristics of the memory 1410 may be improved. As a consequence, performance characteristics of the microprocessor 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a write circuit suitable for generating a first current; a first selection circuit suitable for coupling the first write circuit to a first line based on a first selection signal; a second write circuit suitable for generating a second current; a second selection circuit suitable for coupling the second write circuit to a second line based on a second selection signal; a memory cell coupled between the first line and the second line; and a voltage control circuit suitable for controlling a voltage level of the second line. Through this, characteristics of the buffer memory 1440 may be improved. As a consequence, performance characteristics of the microprocessor 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 5-9 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An electronic device, comprising a semiconductor memory that includes:
    a first write circuit configured for generating a first current;
    a first selection circuit configured for coupling the first write circuit to a first line based on a column selection signal;
    a second write circuit configured for generating a second current;
    a second selection circuit configured for coupling the second write circuit to a second line based on a row selection signal;
    a memory cell including a variable resistance element coupled to the first line and a selection element coupled between the variable resistance element and the second line, coupled between the first line and the second line; and
    a voltage control circuit configured for limiting a voltage level of the second line with a predetermined voltage when the selection element is turned on and a voltage level of the second line is greater than the predetermined voltage during a write operation of the memory cell,
    wherein the first line includes a bit line and the second line includes a word line,
    wherein the word line supplies the second current to the memory cell to turn on/off the selection element.

2. The electronic device according to claim 1, wherein the first write circuit and the first selection circuit operate in a first voltage domain.

3. The electronic device according to claim 2, wherein the second write circuit and the second selection circuit operate in a second voltage domain.

4. The electronic device according to claim 3, wherein the second voltage domain is lower than the first voltage domain.

5. The electronic device according to claim 4, wherein the first voltage domain includes a voltage range between a ground voltage and a positive voltage, and
    the second voltage domain includes a voltage range between a negative voltage and the ground voltage.

6. The electronic device according to claim 1, wherein the first current includes a write current for controlling a resistance state of the variable resistance element, and
    the second current includes a threshold current for controlling a switching operation of the selection element.

7. The electronic device according to claim 1, wherein the voltage control circuit is coupled to the second line or a node between the second line and the second write circuit.

8. The electronic device according to claim 7, wherein the voltage control circuit includes one of a diode, a diode-connected PMOS transistor and a diode-connected NMOS transistor, which is coupled between a bias voltage terminal where a bias voltage is supplied and the second line or coupled between the bias voltage terminal and the node.

9. The electronic device according to claim 7, wherein the voltage control circuit includes a precharge element for coupling a precharge voltage terminal where a precharge voltage is supplied to the second line based on a precharge signal.

10. The electronic device of claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed, wherein the semiconductor memory is part of the memory unit in the microprocessor.

11. The electronic device of claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory that is part of the cache memory unit in the processor.

12. The electronic device of claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

13. The electronic device of claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

14. The electronic device of claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

15. The electronic device according to claim 1, wherein the voltage control circuit is coupled to a first node between the second write circuit and the second selection circuit and a bias voltage terminal or a second node of the second line between the memory cell and the second selection circuit and the bias voltage terminal.

16. A method for driving an electronic device including a semiconductor memory, comprising:
supplying a high voltage through a first line coupled to one side of a memory cell and supplying a low voltage through a second line coupled to the other side of the memory cell;
controlling a second current including a threshold current for controlling a switching operation of a selection element included in the memory cell to flow into the memory cell;
controlling the second line with a predetermined voltage between the high voltage and the low voltage when the selection element is turned on and a voltage level of the second line is greater than the predetermined voltage during a write operation of the memory cell; and
controlling a first current including a write current for controlling a resistance state of a variable resistance element included in the memory cell to flow in the memory cell,
wherein the first line includes a bit line and the second line includes a word line,
wherein the variable resistance element is coupled to the first line and the selection element is coupled between the variable resistance element and the second line,
wherein the word line supplies the second current to the memory cell to turn on/off the selection element,
wherein the write current corresponding a write data is supplied to the variable resistance element through the bit line.

17. The method according to claim 16, wherein the high voltage includes a positive voltage, and
the low voltage includes a negative voltage, and
the predetermined voltage includes a ground voltage.

18. The method according to claim 16, wherein the first current is generated from a first write circuit coupled between the first line and a supply terminal of the high voltage, and
the second current is generated from a second write circuit coupled between the second line and a supply terminal of the low voltage.

19. An electronic device, comprising a semiconductor memory that includes:
a first write circuit configured for generating a first current;
a first selection circuit configured for coupling the first write circuit to a first line based on a column selection signal;
a second write circuit configured for generating a second current;
a second selection circuit configured for coupling the second write circuit to a second line based on a row selection signal;
a memory cell including a variable resistance element coupled to the first line and a selection element coupled between the variable resistance element and the second line, coupled between the first line and the second line; and
a voltage control circuit configured for preventing a leakage current due to a PN junction within the first selection circuit from flowing to the first line during a write operation of the memory cell,
wherein the first line includes a bit line and the second line includes a word line, wherein the voltage control circuit is coupled to a first node of the second line between the second write circuit and the second selection circuit and a bias voltage terminal or a second node of the second line between the memory cell and the second selection circuit and the bias voltage terminal.

20. The electronic device according to claim 19, wherein the voltage control circuit includes one of a diode, a diode-connected PMOS transistor and a diode-connected NMOS transistor, which is coupled between the bias voltage terminal where a bias voltage is supplied and the second line or coupled between the bias voltage terminal and the first node.

21. The electronic device according to claim 19, wherein the voltage control circuit includes a precharge element for coupling a precharge voltage terminal where a precharge voltage is supplied to the second line based on a precharge signal.

* * * * *